(12) United States Patent
Wakaki (10) Patent No.: US 10,854,789 B2
(45) Date of Patent: Dec. 1, 2020

(54) LIGHT-EMITTING DEVICE

(71) Applicant: NICHIA CORPORATION, Anan (JP)

(72) Inventor: Ryosuke Wakaki, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/396,243

(22) Filed: Apr. 26, 2019

(65) Prior Publication Data

US 2019/0348574 A1 Nov. 14, 2019

(30) Foreign Application Priority Data

May 8, 2018 (JP) ................. 2018-089676

(51) Int. Cl.
*H01L 33/48* (2010.01)
*H01L 33/52* (2010.01)
*H01L 33/62* (2010.01)

(52) U.S. Cl.
CPC ............ *H01L 33/486* (2013.01); *H01L 33/52* (2013.01); *H01L 33/62* (2013.01)

(58) Field of Classification Search
CPC .................................................. H01L 33/486
See application file for complete search history.

(56) References Cited

U.S. PATENT DOCUMENTS

| | | | | |
|---|---|---|---|---|
| 8,581,396 | B2* | 11/2013 | Hasebe | H01L 24/32 257/730 |
| 8,604,507 | B2* | 12/2013 | Fujitomo | H01L 24/97 257/99 |
| 9,287,476 | B2* | 3/2016 | Ichikawa | H01L 33/0095 |
| 2001/0022390 | A1* | 9/2001 | Waitl | H01L 31/0203 257/666 |
| 2010/0314654 | A1* | 12/2010 | Hayashi | H01L 33/486 257/99 |
| 2013/0187188 | A1* | 7/2013 | Sasaoka | H01L 33/62 257/99 |
| 2013/0221509 | A1 | 8/2013 | Oda et al. | |
| 2013/0343067 | A1* | 12/2013 | Okada | F21V 21/00 362/382 |
| 2014/0252574 | A1 | 9/2014 | Nakabayashi et al. | |
| 2014/0252582 | A1 | 9/2014 | Nakabayashi et al. | |
| 2015/0014722 | A1 | 1/2015 | Lin | |

(Continued)

FOREIGN PATENT DOCUMENTS

| CN | 205542862 U | 8/2016 |
|---|---|---|
| JP | 2013-58739 A | 3/2013 |

(Continued)

*Primary Examiner* — Eugene Lee
(74) *Attorney, Agent, or Firm* — Birch, Stewart, Kolasch & Birch, LLP (57) ABSTRACT

A light-emitting device includes a first lead having a first lateral surface, a second lead having a second lateral surface, and a resin portion. The first lateral surface of a first lead facing a second lead has a first recess that is recessed so as to be away from the second lead toward the first lead in a top view, and is continuous with an end of a first groove. The second lateral surface of the second lead facing the first lead has a second recess that is recessed so as to be away from the first lead toward the second lead in the top view, and is continuous with an end of a second groove. In the top view, a part of the resin portion is continuously disposed between the end of the first groove and the end of the second groove.

20 Claims, 7 Drawing Sheets

(56) References Cited

U.S. PATENT DOCUMENTS

2016/0155911 A1* 6/2016 Abe ................. H01L 33/486
                                                    257/99
2016/0190413 A1* 6/2016 Abe ................. H01L 21/4846
                                                    257/99
2019/0165233 A1* 5/2019 Horikawa ............ H01L 33/62

FOREIGN PATENT DOCUMENTS

| JP | 2014-60370 A | 4/2014 |
| JP | WO2014/136824 A1 | 9/2014 |
| JP | 2014-197674 A | 10/2014 |
| JP | 2015-201608 A | 11/2015 |
| JP | 2015-213198 A | 11/2015 |
| KE | 2014-165197 A | 9/2014 |
| WO | WO 2012/060336 A1 | 5/2012 |

* cited by examiner

LIGHT-EMITTING DEVICE

CROSS-REFERENCE TO RELATED APPLICATION

This application claims priority to Japanese Patent Application No. 2018-089676, filed on May 8, 2018, the disclosure of which is hereby incorporated by reference in its entirety.

BACKGROUND

The present disclosure relates to a light-emitting device.

Regarding a flat lead package in which a light-emitting element is mounted, a structure of a lead having a groove on its upper surface to improve adhesion between the lead and a resin portion is known (See for example, Japanese Patent No. 6167556).

For example, such a light-emitting device receives a force such as bending from a secondary mounting board on or above which the light-emitting device has been mounted, and stress such as bending stress may be produced in the light-emitting device.

The present disclosure provides a light-emitting device that can reduce stress such as bending stress.

SUMMARY

In a mode of the present disclosure, a light-emitting device includes a package and a light-emitting element. The package includes a first lead having a first groove on an upper surface, a second lead having a second groove on an upper surface and separated from the first lead, and a resin portion holding the first lead and the second lead. The package has a depressed portion defined by one or more lateral walls and a bottom surface. The upper surface of the first lead and the upper surface of the second lead are exposed on the bottom surface of the package. The first groove and the second groove are embedded in a lateral wall of the depressed portion. The light-emitting element is mounted on or above the bottom surface of the depressed portion. A first lateral surface of the first lead facing the second lead has a first recess that is recessed so as to be away from the second lead toward the first lead in a top view, and is continuous with an end of the first groove. A second lateral surface of the second lead facing the first lead has a second recess that is recessed so as to be away from the first lead toward the second lead in the top view, and is continuous with an end of the second groove. In the top view, a part of the resin portion is continuously disposed between the end of the first groove and the end of the second groove.

The light-emitting device of the present disclosure can reduce stress such as bending stress.

DETAILED DESCRIPTION OF EMBODIMENTS

Embodiments will be described below referring to the accompanying drawings. In the drawings, the same reference numeral is assigned to the same constituent.

Figure 1:
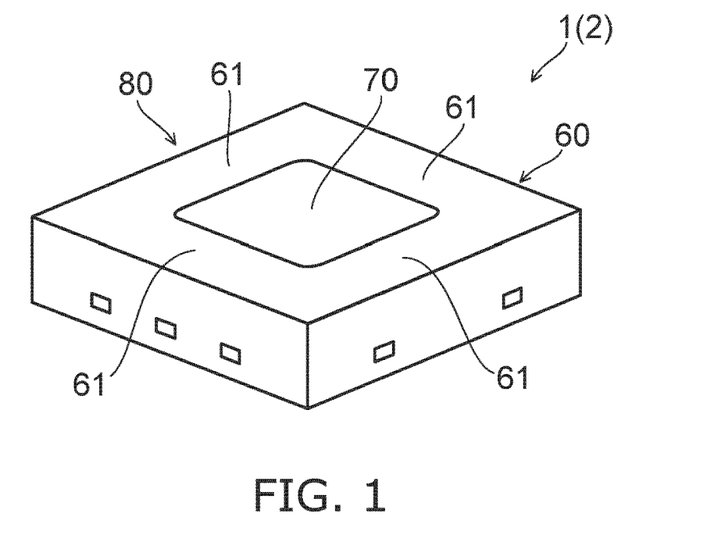
FIG. 1 is a schematic perspective view of a light-emitting device of certain embodiments of the present disclosure.

FIG. 1 is a schematic perspective view of a light-emitting device 1 of a first embodiment of the present disclosure.

Figure 2:
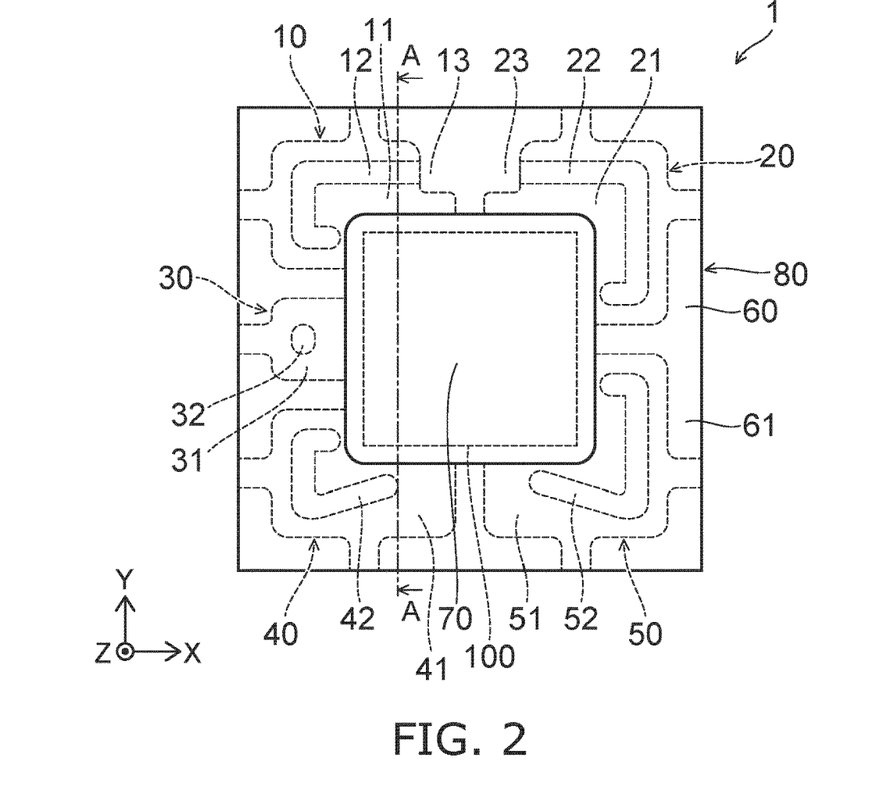
FIG. 2 is a schematic top view of a light-emitting device of a first embodiment of the present disclosure.

FIG. 2 is a schematic top view of the light-emitting device 1. In FIG. 2, hidden elements such as light-emitting element 100 and first to fifth leads 10, 20, 30, 40, and 50 are indicated by dashed lines.

Figure 3:
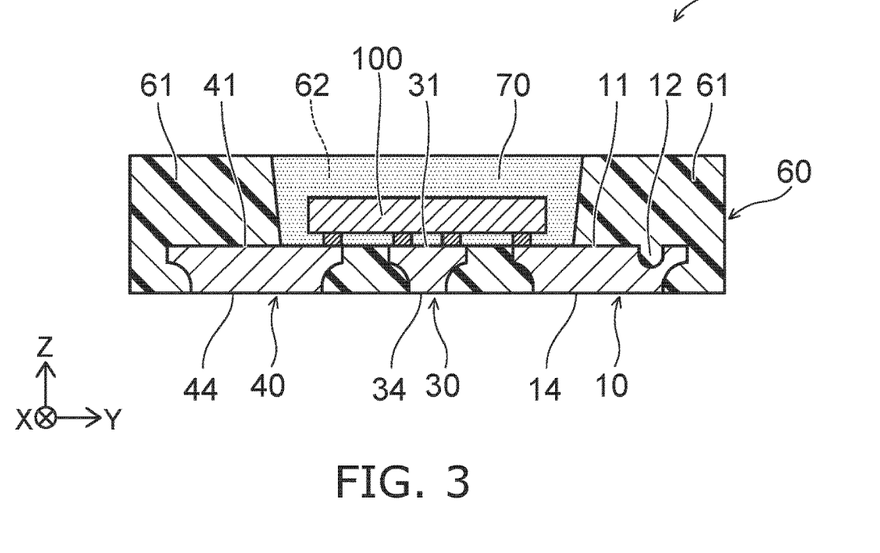
FIG. 3 is a schematic sectional view taken along the line A-A of FIG. 2.

FIG. 3 is a schematic sectional view taken along the line A-A of FIG. 2.

The light-emitting device 1 includes a package 80 and the light-emitting element 100.

Figure 4:
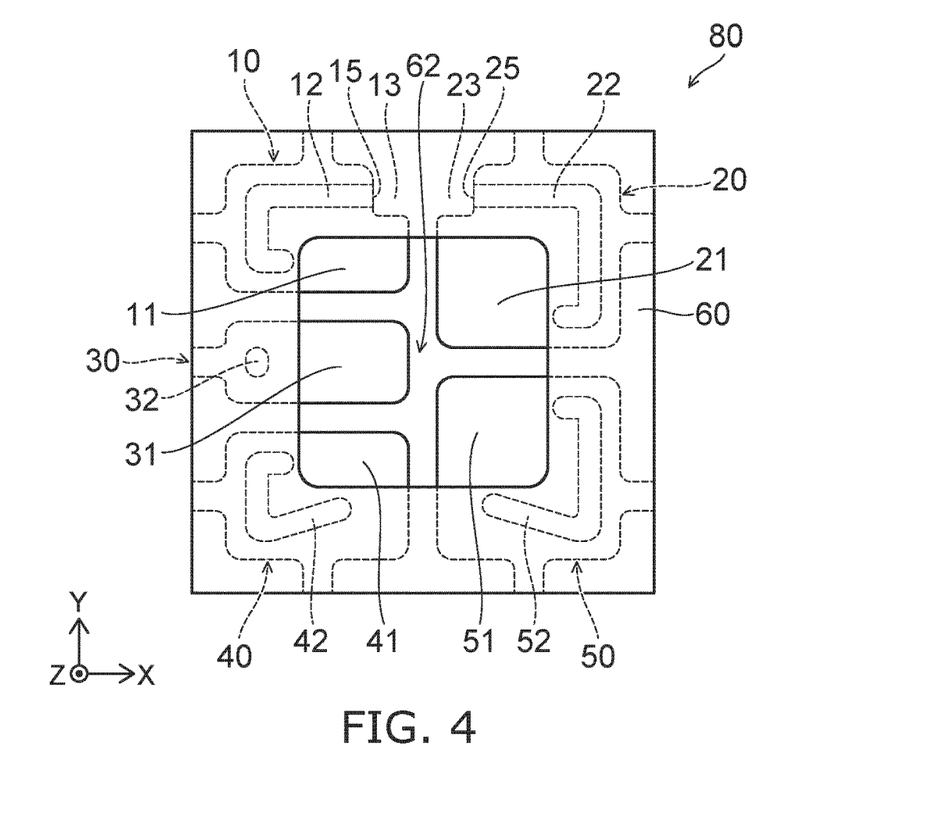
FIG. 4 is a schematic top view of a package of the light-emitting device of the first embodiment of the present disclosure.

FIG. 4 is a schematic top view of the package 80 before the light-emitting element 100 is disposed. In FIG. 4, hidden elements (the light-emitting element 100 and the first to fifth leads 10, 20, 30, 40, and 50) are indicated by dashed lines.

The package 80 includes the first lead 10, the second lead 20, the third lead 30, the fourth lead 40, the fifth lead 50, and a resin portion 60.

The resin portion 60 holds the first lead 10, the second lead 20, the third lead 30, the fourth lead 40, and the fifth lead 50.

In the present specification, the direction from the first lead 10 to the second lead 20 is referred to as a first direction. A direction intersecting the first direction is referred to as a second direction. In this example, the first direction lies along the X-axis direction in the drawings. The second direction lies along the Y-axis direction perpendicular to the X-axis direction. A direction perpendicular to the first and second directions is referred to as a third direction (i.e., Z-axis direction).

In a top view, the first lead 10 and the second lead 20 are separated from each other in the first direction. The first lead 10 and the third lead 30 are separated from each other in the second direction. The third lead 30 and the fourth lead 40 are separated from each other in the second direction. The third lead 30 is located between the first lead 10 and the fourth lead 40. The second lead 20 and the fifth lead 50 are separated from each other in the second direction. The fourth lead 40 and the fifth lead 50 are separated from each other in the first direction.

The package 80 is provided with a depressed portion 62. A part of an upper surface 11 of the first lead 10, a part of an upper surface 21 of the second lead 20, a part of an upper surface 31 of the third lead 30, a part of an upper surface 41 of the fourth lead 40, and a part of an upper surface 51 of the fifth lead 50 are exposed on the bottom surface of the depressed portion 62. On the bottom surface of the depressed portion 62, it is preferable that the parts of the upper surfaces 11, 21, 31, 41, and 51 of the first to fifth leads 10, 20, 30, 40, and 50 be substantially flush with the resin portion 60. With this structure, the light emitting element 100 is less likely to be slanted when being mounted on or above the bottom surface of the depressed portion 62.

The package 80 shown in FIG. 4 has a substantially rectangular or square external shape in a top view and has four outer lateral surfaces. The first to fifth leads 10, 20, 30, 40, and 50 are exposed from the resin portion 60 on the outer lateral surfaces of the package 80 and substantially flush with the resin portion 60. As the first to fifth leads 10, 20, 30, 40, and 50 do not extend out from the resin portion 60 on the outer lateral surfaces of the package 80, a small light-emitting device 1 with a small occupation area is provided.

The package 80 has an upper surface and a lower surface opposite to the upper surface. The lower surface of the package 80 functions as a mounting surface used for mounting on a mounting board. The first to fifth leads 10, 20, 30, 40, and 50 are exposed from the resin portion 60 on the lower surface of the package 80. FIG. 3 shows a lower surface 14 of the first lead 10, a lower surface 34 of the third lead 30, and a lower surface 44 of the fourth lead 40 exposed from the resin portion 60. This structure allows heat generated from the light-emitting element 100 to be efficiently dissipated through the first to fifth leads 10, 20, 30, 40, and 50.

As shown in FIG. 2 and FIG. 3, the light-emitting element 100 is mounted on or above the bottom surface of the depressed portion 62. The light-emitting element 100 is, for example, a light-emitting diode (LED). The light-emitting element 100 is, for example, a light-emitting element in which positive and negative electrodes are formed on the same surface, and is disposed such that the positive and negative electrodes of the light-emitting element 100 face the first to fifth leads 10, 20, 30, 40, and 50 with bonding members therebetween. The light-emitting element 100 shown in FIG. 2 and FIG. 3 is electrically connected to the package 80 without wires, but the present disclosure is not required to this structure. The positive and negative electrodes of the light-emitting element 100 may be electrically connected to the leads of the package 80 via wires.

A light-transmissive resin 70 is disposed in the depressed portion 62 to cover the light-emitting element 100. The light-transmissive resin 70 is, for example, a phosphor layer containing phosphor particles. The light-transmissive resin 70 may further contain a scattering material.

Figure 5:
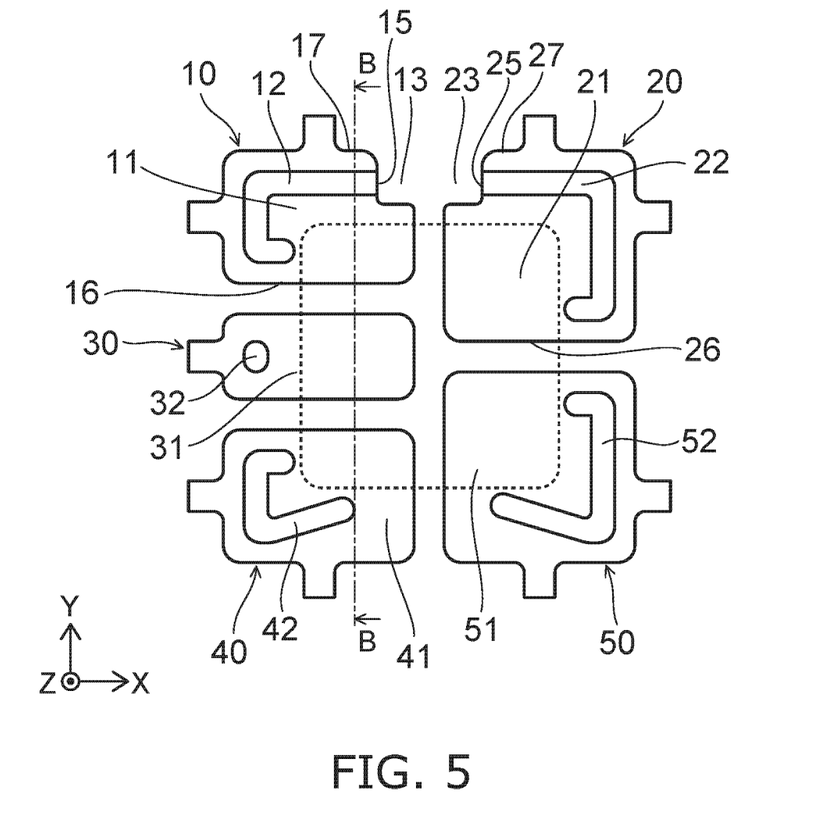
FIG. 5 is a schematic top view of leads in the light-emitting device of the first embodiment of the present disclosure.

FIG. 5 is a schematic top view of the first lead 10, the second lead 20, the third lead 30, the fourth lead 40, and the fifth lead 50. The position of the depressed portion 62 of the package 80 is indicated by a dashed line.

Figure 6:
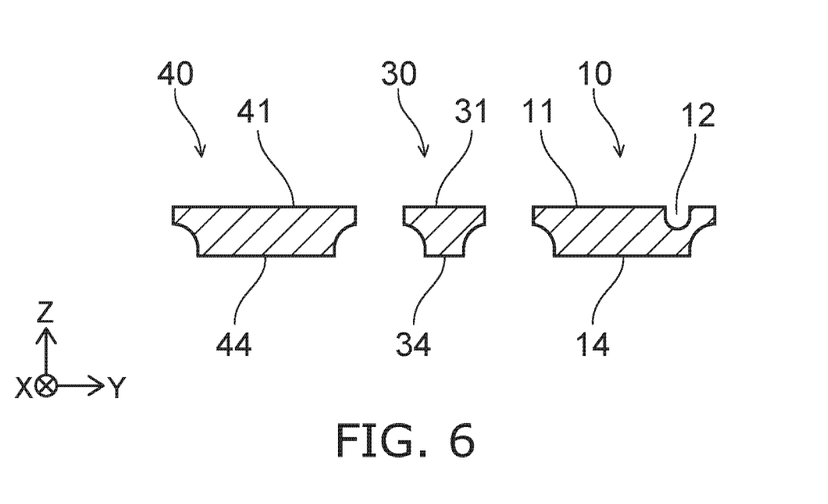
FIG. 6 is a schematic sectional view taken along the line B-B of FIG. 5.

FIG. 6 is a schematic sectional view taken along the line B-B of FIG. 5.

The first lead 10, the second lead 20, the third lead 30, the fourth lead 40, and the fifth lead 50 are each formed of a metal material. The first lead 10, the second lead 20, the third lead 30, the fourth lead 40, and the fifth lead 50 each include, for example, a base material formed of a copper material and a silver-containing layer located on the surface of the base material. As the silver-containing layer is disposed on the outermost surfaces of the first to fifth leads 10, 20, 30, 40, and 50, light emitted from the light-emitting element 100 can efficiently be extracted. The thickness of each of the first to fifth leads 10, 20, 30, 40, and 50 is, for example, 150 μm to 300 μm.

The first lead 10 has the upper surface 11 and the lower surface 14 (shown in FIG. 6) opposite to the upper surface 11. The resin portion 60 constitutes lateral walls 61. The upper surface 11 has a portion embedded in a lateral wall 61 defining the depressed portion 62. A groove (e.g., first groove) 12 is formed on the portion of the upper surface 11 embedded in the lateral wall 61. The groove 12 is, for example, a groove that has a bottom and does not penetrate through the first lead 10.

The second lead 20 has the upper surface 21 and the lower surface opposite to the upper surface 21. The upper surface 21 has a portion embedded in the lateral wall 61 defining the depressed portion 62. A groove (e.g., second groove) 22 is formed on the portion of the upper surface 21 embedded in the lateral wall 61. The groove 22 is, for example, a groove that has a bottom and does not penetrate through the second lead 20.

The third lead 30 has the upper surface 31 and the lower surface 34 (shown in FIG. 6) opposite to the upper surface 31. The upper surface 31 has a portion embedded in the lateral wall 61 defining the depressed portion 62. A groove (e.g., third groove) 32 is formed on the portion of the upper surface 31 embedded in the lateral wall 61. The groove 32 is, for example, a groove that has a bottom and does not penetrate through the third lead 30.

The fourth lead 40 has the upper surface 41 and the lower surface 44 (shown in FIG. 6) opposite to the upper surface 41. The upper surface 41 has a portion embedded in the lateral wall 61 defining the depressed portion 62. A groove (e.g., fourth groove) 42 is formed on the portion of the upper surface 41 embedded in the lateral wall 61. The groove 42 is, for example, a groove that has a bottom and does not penetrate through the fourth lead 40.

The fifth lead 50 has the upper surface 51 and the lower surface opposite to the upper surface 51. The upper surface 51 has a portion embedded in the lateral wall 61 defining the depressed portion 62. A groove (e.g., fifth groove) 52 is formed on the portion of the upper surface 51 embedded in the lateral wall 61. The groove 52 is, for example, a groove that has a bottom and does not penetrate through the fifth lead 50.

The depths of the grooves 12, 22, 32, 42, and 52 are 0.01 times to 0.8 times, preferably 0.1 times to 0.4 times, more preferably 0.2 times to 0.3 times as large as the thicknesses of the first to fifth leads 10, 20, 30, 40, and 50.

As shown in FIG. 5, the first lead 10 has a first lateral surface 15 facing the second lead 20. A part of the first lateral surface 15 of the first lead 10 facing the second lead 20 is recessed so as to be away from the second lead 20 toward the first lead 10 in a top view shown in FIG. 5. The first lateral surface 15 has a first recess 13 continuous with an end of the groove 12 formed on the upper surface 11 of the first lead 10.

The first lead 10 further has a third lateral surface 16 facing the third lead 30 and a fourth lateral surface 17 opposite to the third lateral surface 16. The first recess 13 is also recessed so as to be away from the fourth lateral surface 17 in the second direction. In other words, the first recess 13 opens to both of the first lateral surface 15 and the fourth lateral surface 17. In the case where stress such as bending stress is applied to the package 80, the stress may be concentrated on a portion of the outer lateral surface farther from the geometric center of the package 80 in a top view. In such a case, as the first recess 13 opens to both of the first lateral surface 15 and the fourth lateral surface 17, the resin portion 60 comes into contact with a large part of the first lateral surface 15 of the first lead 10 located near the outer lateral surface of the package 80, thereby enhancing the strength of the package 80.

The second lead 20 has a second lateral surface 25 facing the first lead 10. A part of the second lateral surface 25 of the second lead 20 facing the first lead 10 is recessed so as to be away from the first lead 10 toward the second lead 20 in a top view shown in FIG. 5. The second lateral surface 25 has a second recess 23 continuous with an end of the groove 22 formed on the upper surface 21 of the second lead 20.

The second lead 20 further has a fifth lateral surface 26 facing the fifth lead 50 and a sixth lateral surface 27 opposite to the fifth lateral surface 26. The second recess 23 is also recessed so as to be away from the sixth lateral surface 27 in the second direction. In other words, the second recess 23 opens to both of the second lateral surface 25 and the sixth lateral surface 27. The width of the first recess 13 in the second direction is equal to or larger than the width of the groove 12, and the width of the second recess 23 in the second direction is equal to or larger than the width of the groove 22.

In a top view shown in FIG. 4, a part of the resin portion 60 is continuously disposed between the end of the groove 12 continuous with the first lateral surface 15 of the first lead 10 and the end of the groove 22 continuous with the second lateral surface 25 of the second lead 20. No lead, or metal portion, is positioned between the end of the groove 12 continuous with the first lateral surface 15 of the first lead 10 and the end of the groove 22 continuous with the second lateral surface 25 of the second lead 20. This structure can enhance the bonding strength between the first and second leads 10 and 20 and the resin portion 60.

In the package 80 shown in FIG. 4, the first recess 15 and the second recess 23 are formed at positions near the outer lateral surfaces within the first lateral surface 15 and the second lateral surface 25 in the outer edges of the leads 10 and 20. In this structure, a clearance between the first lateral surface 15 of the first lead 10 and the second lateral surface 25 of the second lead 20 in the first direction is longest at the outer edge near the outer lateral surface in a top view. This structure can enhance the bonding strength between the first and second leads 10 and 20 and the resin portion 60.

Figure 7:
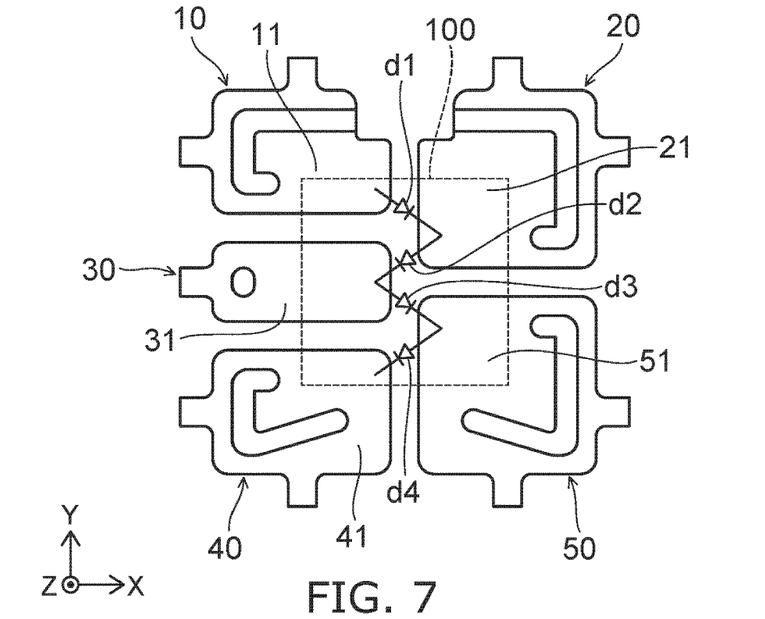
FIG. 7 is a schematic diagram illustrating connections between the leads and a light-emitting element in the light-emitting device of the first embodiment of the present disclosure.

FIG. 7 is a schematic diagram illustrating connections between the leads (the first lead 10, the second lead 20, the third lead 30, the fourth lead 40, and the fifth lead 50) and the light-emitting element 100.

The light-emitting element 100 includes, for example, four light-emitting units (or diode element units) d1 to d4. Each of the light-emitting units d1 to d4 has two terminals (i.e., anode-side terminal and cathode-side terminal).

For example, the anode-side terminal of the light-emitting unit d1 is connected to the upper surface 11 of the first lead 10, and the cathode-side terminal of the light-emitting unit d1 is connected to the upper surface 21 of the second lead 20. The anode-side terminal of the light-emitting unit d2 is connected to the upper surface 21 of the second lead 20, and the cathode-side terminal of the light-emitting unit d2 is connected to the upper surface 31 of the third lead 30. The anode-side terminal of the light-emitting unit d3 is connected to the upper surface 31 of the third lead 30, and the cathode-side terminal of the light-emitting unit d3 is connected to the upper surface 51 of the fifth lead 50. The anode-side terminal of the light-emitting unit d4 is connected to the upper surface 51 of the fifth lead 50, and the cathode-side terminal of the light-emitting unit d4 is connected to the upper surface 41 of the fourth lead 40.

The light-emitting units d1 to d4 are connected in series between the first lead 10 to which an anode potential is applied and the fourth lead 40 to which a cathode potential is applied.

In the embodiment described above, the resin portion runs over the grooves in the leads to enhance the adhesion between the resin portion and the leads.

In addition, at least one recess is partially formed between lateral surfaces of at least one pair of leads facing each other to provide a region where the resin portion occupies in large area between the lateral surfaces.

For example, in the first embodiment, the first recess 13 and the second recess 23 are formed between the first lead 10 and the second lead 20. Forming the first recess 13 and the second recess 23 can further enhance the adhesion between the first lead 10 and the resin portion 60 and the adhesion between the second lead 20 and the resin portion 60.

As the region where the resin portion occupies in large area is formed in a region between the first lead 10 and the second lead 20, the portion can alleviate the stress such as bending stress applied on the package 80.

The resin portion 60 in a fluid state is supplied to a mold in which a lead frame including the leads 10, 20, 30, 40, and 50 is placed, and the resin portion 60 is then cured. As the first recess 13 is continuous with the groove 12 and the second recess 23 is continuous with the groove 22, the resin portion 60 easily flows into the first recess 13 and the second recess 23 through the grooves 12 and 22 when the resin portion 60 is to be formed. This structure enables reduction of strain in formation of the resin portion 60.

Subsequently, a second embodiment will be described.

The same constituent as in the first embodiment is indicated by the same reference numeral, and its detailed description is omitted.

FIG. 1 is a schematic perspective view of a light-emitting device 2 of the second embodiment. The external appearance of the light-emitting device 2 of the second embodiment is the same as the external appearance of the light-emitting device 1 of the first embodiment.

Figure 8:
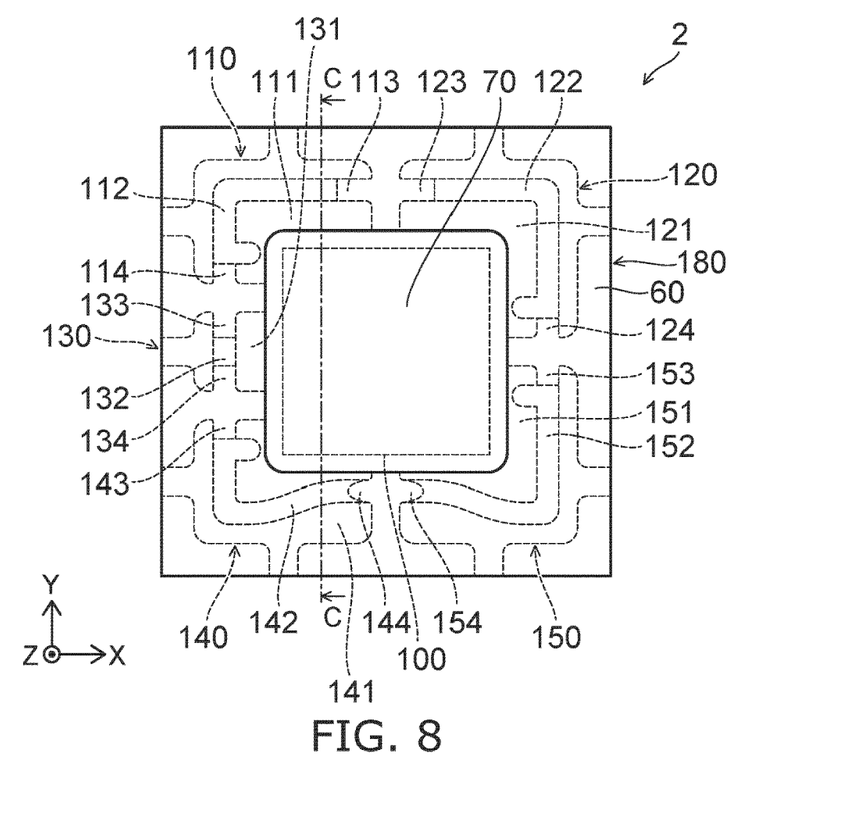
FIG. 8 is a schematic top view of a light-emitting device of a second embodiment of the present disclosure.

FIG. 8 is a schematic top view of the light-emitting device 2 of the second embodiment. In FIG. 8, hidden elements (the light-emitting element 100 and first to fifth leads 110, 120, 130, 140, and 150) are indicated by dashed lines.

Figure 9:
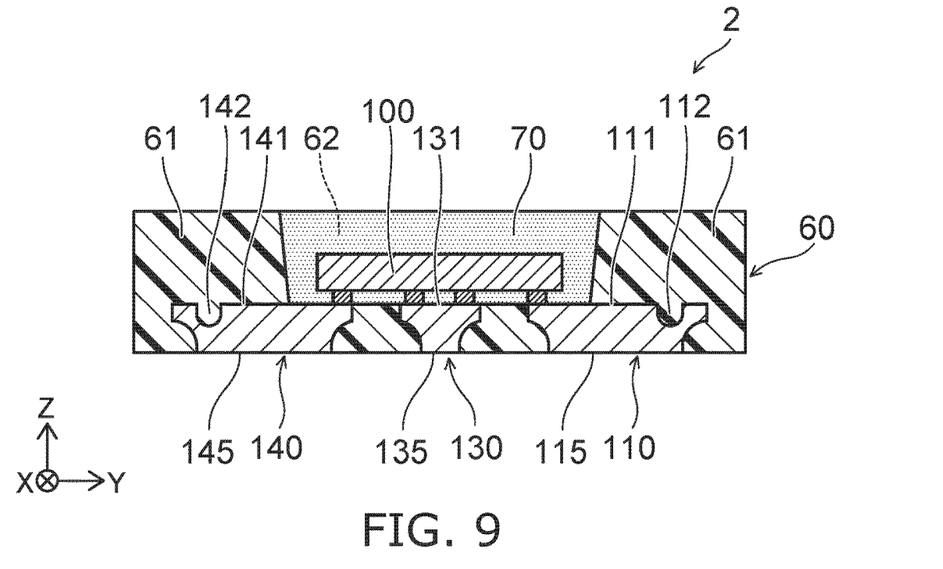
FIG. 9 is a schematic sectional view taken along the line C-C of FIG. 8.

FIG. 9 is a schematic sectional view taken along the line C-C of FIG. 8.

The light-emitting device 2 includes a package 180 and the light-emitting element 100.

Figure 10:
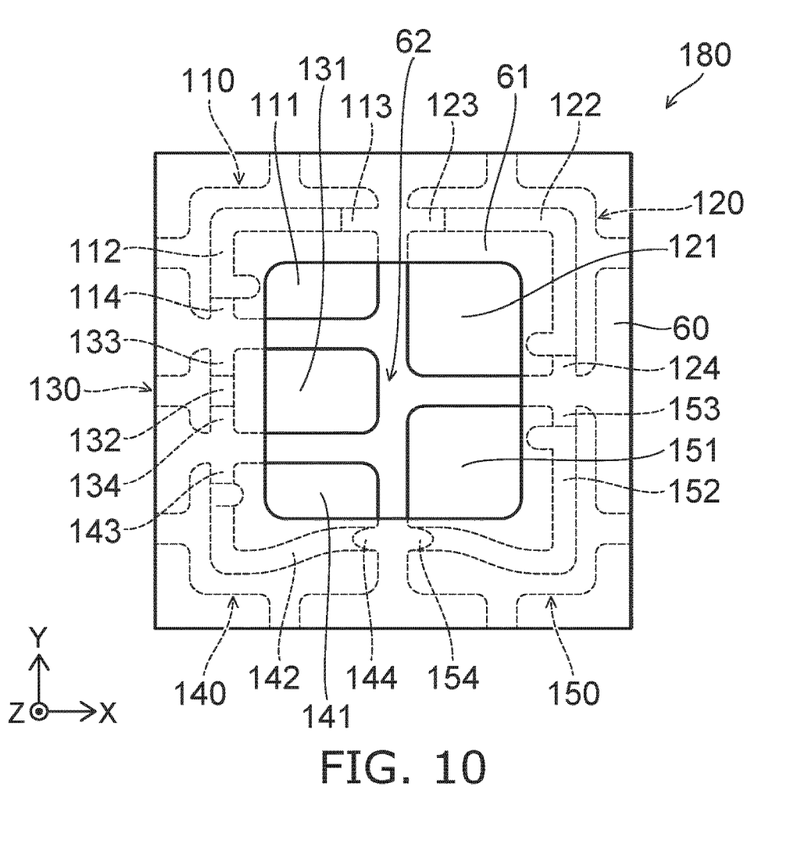
FIG. 10 is a schematic top view of a package of the light-emitting device of the second embodiment of the present disclosure.

FIG. 10 is a schematic top view of the package 180 before the light-emitting element 100 is disposed. In FIG. 10, hidden elements (the light-emitting element 100 and the first to fifth leads 110, 120, 130, 140, and 150) are indicated by dashed lines.

The package 180 includes the first lead 110, the second lead 120, the third lead 130, the fourth lead 140, the fifth lead 150, and the resin portion 60.

The resin portion 60 holds the first lead 110, the second lead 120, the third lead 130, the fourth lead 140, and the fifth lead 150.

In a top view, the first lead 110 and the second lead 120 are separated from each other in the first direction. The first lead 110 and the third lead 130 are separated from each other in the second direction. The third lead 130 and the fourth lead 140 are separated from each other in the second direction. The third lead 130 is located between the first lead 110 and the fourth lead 140. The second lead 120 and the fifth lead 150 are separated from each other in the second direction. The fourth lead 140 and the fifth lead 150 are separated from each other in the first direction.

The package 180 has the depressed portion 62. A part of an upper surface 111 of the first lead 110, a part of an upper surface 121 of the second lead 120, a part of an upper surface 131 of the third lead 130, a part of an upper surface 141 of the fourth lead 140, and a part of an upper surface 151 of the fifth lead 150 are exposed on the bottom surface of the depressed portion 62. On the bottom surface of the depressed portion 62, it is preferable that the parts of the upper surfaces 111, 121, 131, 141, and 151 of the first to fifth leads 110, 120, 130, 140, and 150 be substantially flush with the resin portion 60. With this structure, the light emitting element 100 is less likely to be slanted when being mounted on or above the bottom surface of the depressed portion 62.

The package 180 shown in FIG. 10 has a substantially rectangular or square external shape in a top view, and has four outer lateral surfaces. The first to fifth leads 110, 120, 130, 140, and 150 are exposed from the resin portion 60 on the outer lateral surfaces of the package 180 and substantially flush with the resin portion 60. As the first to fifth leads 110, 120, 130, 140, and 150 do not extend out from the resin portion 60 on the outer lateral surfaces of the package 180, a small light-emitting device 2 with a small occupation area is provided.

The package 180 has an upper surface and a lower surface opposite to the upper surface. The lower surface of the package 180 functions as a mounting surface used for mounting on a mounting board. The first to fifth leads 110, 120, 130, 140, and 150 are exposed from the resin portion 60 on the lower surface of the package 180. FIG. 9 shows a lower surface 115 of the first lead 110, a lower surface 135 of the third lead 130, and a lower surface 145 of the fourth lead 140 exposed from the resin portion 60. This structure allows heat generated from the light-emitting element 100 to be efficiently dissipated through the first to fifth leads 110, 120, 130, 140, and 150.

As shown in FIG. 9, the light-emitting element 100 is mounted on or above the bottom surface of the depressed portion 62, and the light-transmissive resin 70 is disposed in the depressed portion 62 to cover the light-emitting element 100.

Figure 11:
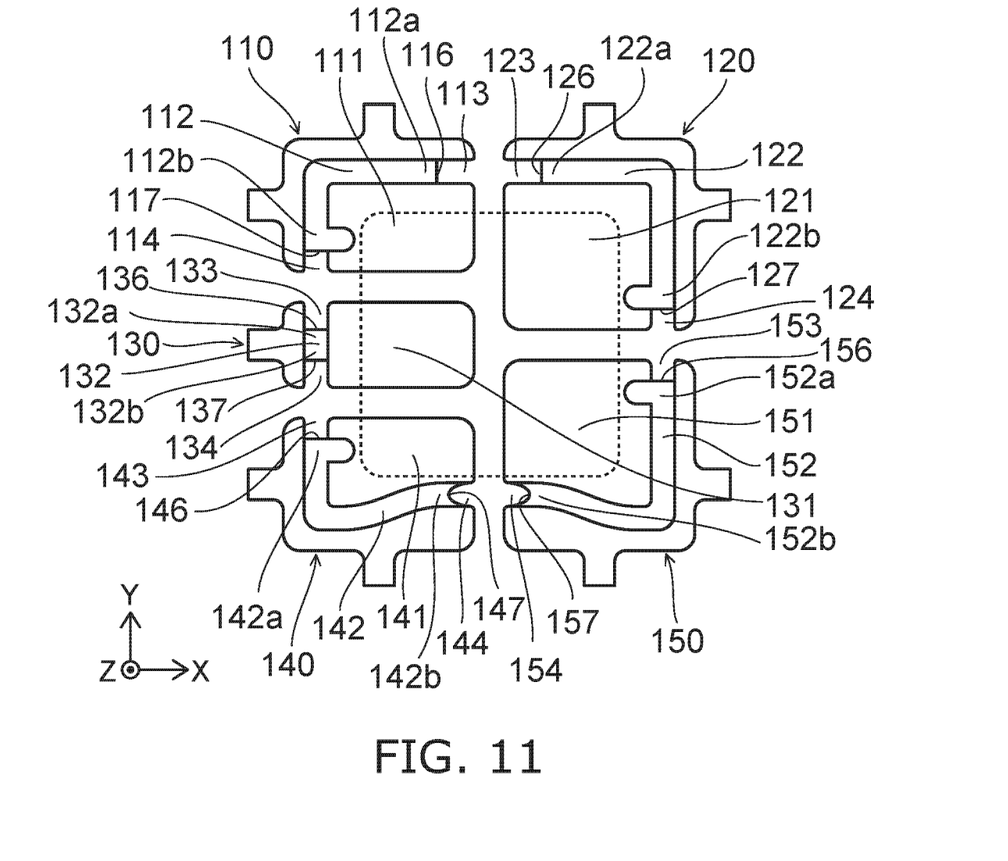
FIG. 11 is a schematic top view of leads in the light-emitting device of the second embodiment of the present disclosure.

FIG. 11 is a schematic top view of the first lead 110, the second lead 120, the third lead 130, the fourth lead 140, and the fifth lead 150. The position of the depressed portion 62 of the package 180 is indicated by a dashed line.

Each of the first lead 110, the second lead 120, the third lead 130, the fourth lead 140, and the fifth lead 150 is formed of a metal material, and includes a base material formed of, for example, a copper material and a silver-containing layer located on the surface of the base material. As the silver-containing layer is disposed on the outermost surfaces of the first to fifth leads 110, 120, 130, 140, and 150, light emitted from the light-emitting element 100 can efficiently be extracted. The thickness of each of the first to fifth leads 110, 120, 130, 140, and 150 is, for example, 150 μm to 300 μm.

The first lead 110 has the upper surface 111 and the lower surface 115 (shown in FIG. 9) opposite to the upper surface 111. The upper surface 111 has a portion embedded in the lateral wall 61 defining the depressed portion 62. A groove (e.g., first groove) 112 is formed on the portion of the upper surface 111 embedded in the lateral wall 61. The groove 112 is, for example, a groove that has a bottom and does not penetrate through the first lead 110.

The second lead 120 has the upper surface 121 and the lower surface opposite to the upper surface 121. The upper surface 121 has a portion embedded in the lateral wall 61 defining the depressed portion 62. A groove (e.g., second groove) 122 is formed on the portion of the upper surface 121 embedded in the lateral wall 61. The groove 122 is, for example, a groove that has a bottom and does not penetrate through the second lead 120.

The third lead 130 has the upper surface 131 and the lower surface 135 (shown in FIG. 9) opposite to the upper surface 131. The upper surface 131 has a portion embedded in the lateral wall 61 defining the depressed portion 62. A groove (e.g., third groove) 132 is formed on the portion of the upper surface 131 embedded in the lateral wall 61. The groove 132 is, for example, a groove that has a bottom and does not penetrate through the third lead 130.

The fourth lead 140 has the upper surface 141 and the lower surface 145 (shown in FIG. 9) opposite to the upper surface 141. The upper surface 141 has a portion embedded in the lateral wall 61 defining the depressed portion 62. A groove (e.g., fourth groove) 142 is formed on the portion of the upper surface 141 embedded in the lateral wall 61. The groove 142 is, for example, a groove that has a bottom and does not penetrate through the fourth lead 140.

The fifth lead 150 has the upper surface 151 and the lower surface opposite to the upper surface 151. The upper surface 151 has a portion embedded in the lateral wall 61 defining the depressed portion 62. A groove (e.g., fifth groove) 152 is formed on the portion of the upper surface 151 embedded in the lateral wall 61. The groove 152 is, for example, a groove that has a bottom and does not penetrate through the fifth lead 150.

As shown in FIG. 11, the first lead 110 has a first lateral surface 116 facing the second lead 120. A part of the first lateral surface 116 of the first lead 110 facing the second lead 120 is recessed so as to be away from the second lead 120 toward the first lead 110 in a top view shown in FIG. 11. The first lateral surface 116 has a first recess 113 continuous with an end 112a of the groove 112 formed on the upper surface 111 of the first lead 110.

The first lead 110 also has a third lateral surface 117 facing the third lead 130. The third lateral surface 117 of the first lead 110 facing the third lead 130 is recessed so as to be away from the third lead 130 toward the first lead 110 in a top view shown in FIG. 11. The third lateral surface 117 has a third recess 114 continuous with an end 112b of the groove 112 formed on the upper surface 111 of the first lead 110.

The second lead 120 has a second lateral surface 126 facing the first lead 110. The second lateral surface 126 of the second lead 120 facing the first lead 110 is recessed so as to be away from the first lead 110 toward the second lead 120 in a top view shown in FIG. 11. The second lateral surface 126 has a second recess 123 continuous with an end 122a of the groove 122 formed on the upper surface 121 of the second lead 120.

The second lead 120 also has a fifth lateral surface 127 facing the fifth lead 150. The fifth lateral surface 127 of the second lead 120 facing the fifth lead 150 is recessed so as to be away from the fifth lead 150 toward the second lead 120 in a top view shown in FIG. 11. The fifth lateral surface 127 has a fifth recess 124 continuous with an end 122b of the groove 122 formed on the upper surface 121 of the second lead 120.

The third lead 130 has a fourth lateral surface 136 facing the first lead 110. The fourth lateral surface 136 of the third lead 130 facing the first lead 110 is recessed so as to be away from the first lead 110 toward the third lead 130 in a top view shown in FIG. 11. The fourth lateral surface 136 has a fourth recess 133 continuous with an end 132*a* of the groove 132 formed on the upper surface 131 of the third lead 130.

The third lead 130 also has a sixth lateral surface 137 facing the fourth lead 140. The sixth lateral surface 137 of the third lead 130 facing the fourth lead 140 is recessed so as to be away from the fourth lead 140 toward the third lead 130 in a top view shown in FIG. 11. The sixth lateral surface 137 has a sixth recess 134 continuous with an end 132*b* of the groove 132 formed on the upper surface 131 of the third lead 130.

The fourth lead 140 has a seventh lateral surface 146 facing the third lead 130. The seventh lateral surface 146 of the fourth lead 140 facing the third lead 130 is recessed so as to be away from the third lead 130 toward the fourth lead 140 in a top view shown in FIG. 11. The seventh lateral surface 146 has a seventh recess 143 continuous with an end 142*a* of the groove 142 formed on the upper surface 141 of the fourth lead 140.

The fourth lead 140 also has an eighth lateral surface 147 facing the fifth lead 150. The eighth lateral surface 147 of the fourth lead 140 facing the fifth lead 150 is recessed so as to be away from the fifth lead 150 toward the fourth lead 140 in a top view shown in FIG. 11. The eighth lateral surface 147 has an eighth recess 144 continuous with an end 142*b* of the groove 142 formed on the upper surface 141 of the fourth lead 140.

The fifth lead 150 has a ninth lateral surface 156 facing the second lead 120. The ninth lateral surface 156 of the fifth lead 150 facing the second lead 120 is recessed so as to be away from the second lead 120 toward the fifth lead 150 in a top view shown in FIG. 11. The ninth lateral surface 156 has a ninth recess 153 continuous with an end 152*a* of the groove 152 formed on the upper surface 151 of the fifth lead 150.

The fifth lead 150 also has a tenth lateral surface 157 facing the fourth lead 140. The tenth lateral surface 157 of the fifth lead 150 facing the fourth lead 140 is recessed so as to be away from the fourth lead 140 toward the fifth lead 150 in a top view shown in FIG. 11. The tenth lateral surface 157 has a tenth recess 154 continuous with an end 152*b* of the groove 152 formed on the upper surface 151 of the fifth lead 150.

In top views shown in FIG. 10 and FIG. 11, a part of the resin portion 60 is continuously disposed between the end 112*a* of the groove 112 of the first lead 110 facing the second lead 120 and the end 122*a* of the groove 122 of the second lead 120 facing the first lead 110. No lead or metal portion is disposed between the end 112*a* of the groove 112 of the first lead 110 and the end 122*a* of the groove 122 of the second lead 120. In the case where stress such as bending stress is applied on the package 180, the resin portion 60 between the end 112*a* of the first lead 110 and the end 122*a* of the second lead 120 can alleviate the stress such as bending stress, thereby reducing the stress such as bending stress applied on the package 180.

As shown in FIG. 11, the clearance in the first direction between the first lateral surface 116 of the first lead 110 facing the second lead 120 and the second lateral surface 126 of the second lead 120 facing the first lead 110 is largest in the portion having the first recess 113 and the second recess 123.

The width of the first recess 113 in the second direction is equal to or larger than the width of the groove 112, and the width of the second recess 123 in the second direction is equal to or larger than the width of the groove 122.

In top views shown in FIG. 10 and FIG. 11, a part of the resin portion 60 is continuously disposed between the end 112*b* of the groove 112 of the first lead 110 facing the third lead 130 and the end 132*a* of the groove 132 of the third lead 130 facing the first lead 110. No lead or metal portion is disposed between the end 112*b* of the groove 112 of the first lead 110 and the end 132*a* of the groove 132 of the third lead 130. In the case where stress such as bending stress is applied on the package 180, the resin portion 60 between the end 112*b* of the first lead 110 and the end 132*a* of the third lead 130 can alleviate the stress such as bending stress, thereby reducing the stress such as bending stress applied on the package 180.

As shown in FIG. 11, the clearance in the second direction between the third lateral surface 117 of the first lead 110 facing the third lead 130 and the fourth lateral surface 136 of the third lead 130 facing the first lead 110 is largest in the portion having the third recess 114 and the fourth recess 133.

The width of the third recess 114 in the first direction is equal to or larger than the width of the groove 112, and the width of the fourth recess 133 in the first direction is equal to or larger than the width of the groove 132.

In top views shown in FIG. 10 and FIG. 11, a part of the resin portion 60 is continuously disposed between the end 132*b* of the groove 132 of the third lead 130 facing the fourth lead 140 and the end 142*a* of the groove 142 of the fourth lead 140 facing the third lead 130. No lead or metal portion is disposed between the end 132*b* of the groove 132 of the third lead 130 and the end 142*a* of the groove 142 of the fourth lead 140. In the case where stress such as bending stress is applied on the package 180, the resin portion 60 between the end 132*b* of the third lead 130 and the end 142*a* of the fourth lead 140 can alleviate the stress such as bending stress, thereby reducing the stress such as bending stress applied on the package 180.

As shown in FIG. 11, the clearance in the second direction between the sixth lateral surface 137 of the third lead 130 facing the fourth lead 140 and the seventh lateral surface 146 of the fourth lead 140 facing the third lead 130 is largest in the portion having the sixth recess 134 and the seventh recess 143.

The width of the sixth recess 134 in the first direction is equal to or larger than the width of the groove 132, and the width of the seventh recess 143 in the first direction is equal to or larger than the width of the groove 142.

In top views shown in FIG. 10 and FIG. 11, a part of the resin portion 60 is continuously disposed between the end 142*b* of the groove 142 of the fourth lead 140 facing the fifth lead 150 and the end 152*b* of the groove 152 of the fifth lead 150 facing the fourth lead 140. No lead or metal portion is disposed between the end 142*b* of the groove 142 of the fourth lead 140 and the end 152*b* of the groove 152 of the fifth lead 150. In the case where stress such as bending stress is applied on the package 180, the resin portion 60 between the end 142*b* of the fourth lead 140 and the end 152*b* of the fifth lead 150 can alleviate the stress such as bending stress, thereby reducing the stress such as bending stress applied on the package 180.

As shown in FIG. 11, the clearance in the first direction between the eighth lateral surface 147 of the fourth lead 140 facing the fifth lead 150 and the tenth lateral surface 157 of the fifth lead 150 facing the fourth lead 140 is largest in the portion having the eighth recess 144 and the tenth recess 154.

The width of the eighth recess 144 in the second direction is equal to or larger than the width of the groove 142, and the width of the tenth recess 154 in the second direction is equal to or larger than the width of the groove 152.

In top views shown in FIG. 10 and FIG. 11, a part of the resin portion 60 is continuously disposed between the end 122b of the groove 122 of the second lead 120 facing the fifth lead 150 and the end 152a of the groove 152 of the fifth lead 150 facing the second lead 120. No lead or metal portion is disposed between the end 122b of the groove 122 of the second lead 120 and the end 152a of the groove 152 of the fifth lead 150. In the case where stress such as bending stress is applied on the package 180, the resin portion 60 between the end 122b of the second lead 120 and the end 152a of the fifth lead 150 can alleviate the stress such as bending stress, thereby reducing the stress such as bending stress applied on the package 180.

As shown in FIG. 11, the clearance in the second direction between the fifth lateral surface 127 of the second lead 120 facing the fifth lead 150 and the ninth lateral surface 156 of the fifth lead 150 facing the second lead 120 is largest in the portion having the fifth recess 124 and the ninth recess 153.

The width of the fifth recess 124 in the first direction is equal to or larger than the width of the groove 122, and the width of the ninth recess 153 in the first direction is equal to or larger than the width of the groove 152.

Figure 12:
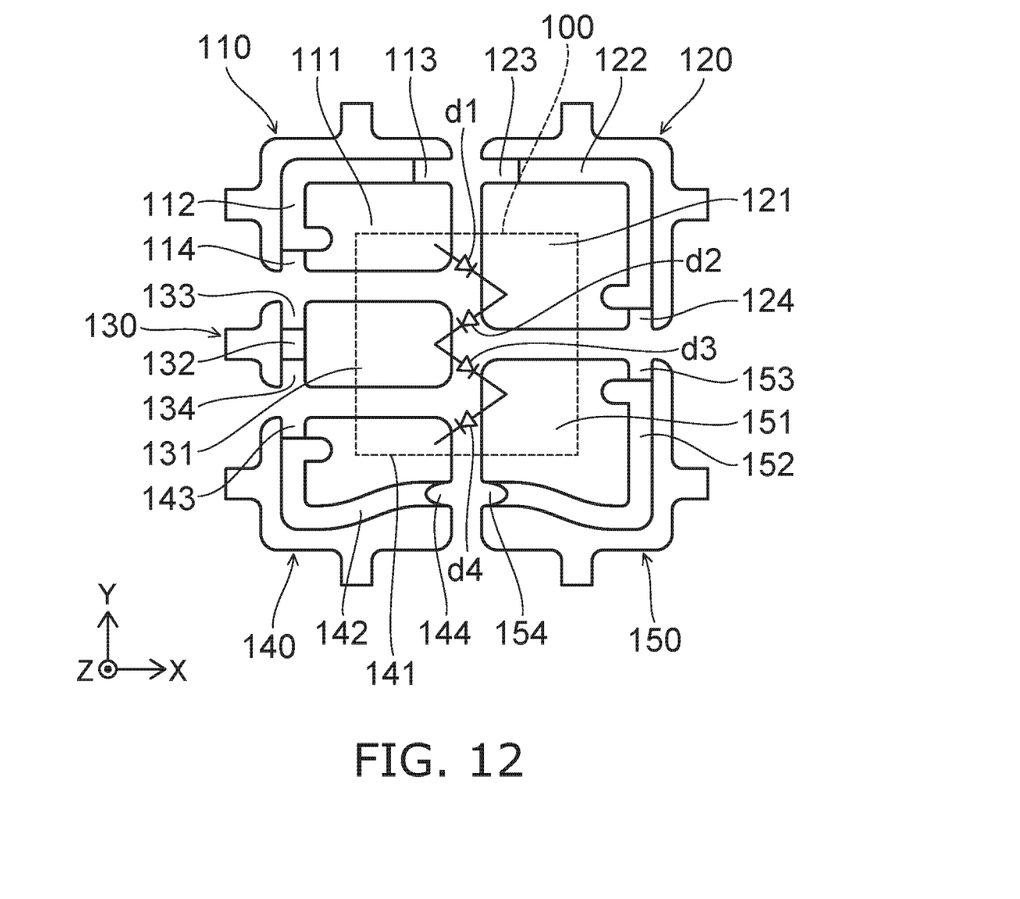
FIG. 12 is a schematic diagram illustrating connections between the leads and the light-emitting element in the light-emitting device of the second embodiment of the present disclosure.

FIG. 12 is a schematic diagram illustrating connections between the leads (including the first lead 110, the second lead 120, the third lead 130, the fourth lead 140, and the fifth lead 150) and the light-emitting element 100.

The light-emitting element 100 includes, for example, the four light-emitting units (or diode element units) d1 to d4. The light-emitting units d1 to d4 each have two terminals (i.e., anode-side terminal and cathode-side terminal).

For example, the anode-side terminal of the light-emitting unit d1 is connected to the upper surface 111 of the first lead 110, and the cathode-side terminal of the light-emitting unit d1 is connected to the upper surface 121 of the second lead 120. The anode-side terminal of the light-emitting unit d2 is connected to the upper surface 121 of the second lead 120, and the cathode-side terminal of the light-emitting unit d2 is connected to the upper surface 131 of the third lead 130. The anode-side terminal of the light-emitting unit d3 is connected to the upper surface 131 of the third lead 130, and the cathode-side terminal of the light-emitting unit d3 is connected to the upper surface 151 of the fifth lead 150. The anode-side terminal of the light-emitting unit d4 is connected to the upper surface 151 of the fifth lead 150, and the cathode-side terminal of the light-emitting unit d4 is connected to the upper surface 141 of the fourth lead 140.

The light-emitting units d1 to d4 are connected in series between the first lead 110 to which an anode potential is applied and the fourth lead 140 to which a cathode potential is applied.

In the embodiment described above, the resin portion runs over the grooves in the leads to enhance the adhesion between the resin portion and the leads.

The recesses are partially formed between the lateral surfaces of the leads facing each other to provide a region where the resin portion occupies in large area between the lateral surfaces.

For example, in the second embodiment, the first recess 113 and the second recess 123 are formed between the first lead 110 and the second lead 120. Forming the first recess 113 and the second recess 123 can further enhance the adhesion between the first lead 110 and the resin portion 60 and the adhesion between the second lead 120 and the resin portion 60.

The third recess 114 and the fourth recess 133 are formed between the first lead 110 and the third lead 130. Forming the third recess 114 and the fourth recess 133 can further enhance the adhesion between the first lead 110 and the resin portion 60 and the adhesion between the third lead 130 and the resin portion 60.

The sixth recess 134 and the seventh recess 143 are formed between the third lead 130 and the fourth lead 140. Forming the sixth recess 134 and the seventh recess 143 can further enhance the adhesion between the third lead 130 and the resin portion 60 and the adhesion between the fourth lead 140 and the resin portion 60.

The eighth recess 144 and the tenth recess 154 are formed between the fourth lead 140 and the fifth lead 150. Forming the eighth recess 144 and the tenth recess 154 further enhances the adhesion between the fourth lead 140 and the resin portion 60 and the adhesion between the fifth lead 150 and the resin portion 60.

The fifth recess 124 and the ninth recess 153 are formed between the second lead 120 and the fifth lead 150. Forming the fifth recess 124 and the ninth recess 153 can further enhance the adhesion between the second lead 120 and the resin portion 60 and the adhesion between the fifth lead 150 and the resin portion 60.

As the regions where the corresponding portions of the resin portion occupy in large areas are respectively formed in regions between the leads 110, 120, 130, 140, and 150, the portions can reduce the stress such as bending stress applied on the package 180.

The resin portion 60 in a fluid state is supplied to a mold in which a lead frame including the leads 110, 120, 130, 140, and 150 is placed, and the resin portion 60 is then cured.

The first recess 113 and the third recess 114 are continuous with the groove 112, the second recess 123 and the fifth recess 124 are continuous with the groove 122, the fourth recess 133 and the sixth recess 134 are continuous with the groove 132, the seventh recess 143 and the eighth recess 144 are continuous with the groove 142, and the ninth recess 153 and the tenth recess 154 are continuous with the groove 152. Thus, when forming the resin portion, the resin portion 60 easily flows into the recesses 113, 114, 123, 124, 133, 134, 143, 144, 153, and 154 through the grooves 112, 122, 132, 142, and 152. This structure enables reduction of strain in formation of the resin portion 60.

A thermosetting resin or a thermoplastic resin can be used for the resin material serving as the base material of the resin portion 60. Specific examples of the resin usable for the resin portion 60 include epoxy resin compositions; silicone resin compositions; modified epoxy resin compositions such as silicone-modified epoxy resins; modified silicone resin compositions such as epoxy-modified silicone resins; unsaturated polyester resins, saturated polyester resins, polyimide resin compositions, and modified polyimide resin compositions; and resins such as polyphthalamide (PPA), polycarbonate resins, polyphenylene sulfide (PPS), liquid crystal polymers (LCPs), ABS resins, phenolic resins, acrylic resins, and PBT resins. In particular, a thermosetting resin, such as epoxy resin compositions and silicone resin compositions, having good resistance to heat and light is preferably used for the resin material for the resin portion 60.

It is preferable that the resin portion 60 contain a light-reflective substance mixed in the resin material serving as the base material. The light-reflective substance is preferably a member that is less likely to absorb light emitted from the light-emitting element 100 and greatly differs in refractive index from the resin material serving as the base material. Examples of such a light-reflective substance include titanium oxide, zinc oxide, silicon oxide, zirconium oxide, aluminum oxide, and aluminum nitride.

To improve the contrast of the light-emitting device 1 or 2, the resin portion 60 may contain a filler having a low light reflectance of extraneous light (in many cases, sunlight) that shines on the light-emitting device 1 or 2. In this case, the color of the resin portion 60 is, for example, black or a similar color. The filler can be selected depending on the purpose, and examples thereof include: carbon materials such as acetylene black, activated carbon, and graphite; transition metal oxides such as iron oxide, manganese dioxide, cobalt oxide, and molybdenum oxide; and colored organic pigments.

The leads 10, 20, 30, 40, 50, 110, 120, 130, 140, and 150 is electrically conductive and function as electrodes used for supplying electricity to the light-emitting element 100. Examples of the base material for the leads 10, 20, 30, 40, 50, 110, 120, 130, 140, and 150 include metals such as copper, aluminum, gold, silver, iron, nickel, alloys of these, phosphor bronze, and copper-iron alloys. A single layer or a layered structure (such as a clad material) may be employed. In particular, copper is preferably used for the base material because it is inexpensive and has high heat dissipation. Each of the leads 10, 20, 30, 40, 50, 110, 120, 130, 140, and 150 may have a silver-containing layer on its surface, and have an intermediate layer between the base material and the silver-containing layer. The intermediate layer may contain, for example, aluminum, nickel, palladium, rhodium, gold, copper, or an alloy of these. The silver-containing layer or the intermediate layer may be disposed over the entire surface or part of the surface of each of the leads 10, 20, 30, 40, 50, 110, 120, 130, 140, and 150. For example, the silver-containing layer or the intermediate layer formed on the upper surface of each of the leads 10, 20, 30, 40, 50, 110, 120, 130, 140, and 150 may be thicker than the silver-containing layer or the intermediate layer formed on the lower surface of each of the leads 10, 20, 30, 40, 50, 110, 120, 130, 140, and 150.

A protective layer formed of silicon oxide or the like can be disposed on the outermost surface (such as the surface of the silver-containing layer) of each of the leads 10, 20, 30, 40, 50, 110, 120, 130, 140, and 150. The protective layer disposed on the surface of the silver-containing layer can effectively alleviate progress of deterioration of the silver-containing layer in the case where, for example, sulfur or the like enters the depressed portion 62. The protective layer can be formed by a vacuum process such as sputtering, but other known methods may be employed.

The packages 80 and 180 each include at least two leads that function as anode-side and cathode-side electrodes. The leads other than these two leads may function as electrodes or heat dissipating members.

A light-emitting diode element or the like can be used for the light-emitting element 100. A nitride semiconductor ($In_xAl_yGa_{1-x-y}N$, where $0 \leq x$, $0 \leq y$, and $x+y \leq 1$), which can emit visible light, is suitable. The light-emitting devices 1 and 2 each include at least one light-emitting element 100. The number of the light-emitting element(s) 100 can be changed depending on the purpose and the intended use.

The light-emitting device 1 or 2 may include a plurality of light-emitting elements each emitting blue light. Alternatively, the plurality of light-emitting elements may be a combination of three light-emitting elements in which one emitting blue light, one emitting green light, and one emitting red light are included, or may be a combination of a light emitting element emitting blue light and a light emitting element emitting green light. In the case where the light-emitting device 1 or 2 is used for a light source for a liquid-crystal display or the like, light-emitting element(s) that emits blue light or a combination of a light-emitting element that emits blue light and a light-emitting element that emits green light is preferably used for the light-emitting element(s). Both of the light-emitting element that emits blue light and the light-emitting element that emits green light are preferably ones emitting light having peak wavelength with half-widths of 40 nm or less, more preferably ones emitting light having peak wavelength with half-widths of 30 nm or less. This structure enables blue and green light to easily have sharp peaks. Accordingly, for example, in the case where the light-emitting device 1 or 2 is used for a light source for a liquid-crystal display, the liquid-crystal display can achieve good color reproducibility.

The light-transmissive resin 70 can protect the light-emitting element 100 and other components from external force, dust, and water. For example, the light-transmissive resin 70 preferably transmits 60% or more, further preferably 90% or more, of light emitted from the light-emitting element 100. A resin material used for the resin portion 60 can be used as the base material of the light-transmissive resin 70. The base material of the light-transmissive resin 70 can be a thermosetting resin, a thermoplastic resin, or the like, and examples thereof include silicone resins, epoxy resins, acrylic resins, or resins including one or more of these resins. The light-transmissive resin 70 may be constituted of a single layer or a plurality of layers. Also, light scattering particles such as titanium oxide, silicon oxide, zirconium oxide, and aluminum oxide can be dispersed in the light-transmissive resin 70.

The light-transmissive resin 70 can contain one or a plurality of types of phosphors that convert the wavelengths of light emitted from the light-emitting element 100. The phosphor(s) can be one that is excitable by light emitted from the light-emitting element 100. Examples of the phosphor usable for the present disclosure include $(Ca,Sr,Ba)_5(PO_4)_3(Cl,Br):Eu$, $(Sr,Ca,Ba)_4Al_{14}O_{25}:Eu$, $(Ca,Sr,Ba)_8MgSi_4O_{16}(F,Cl,Br)_2:Eu$, $(Y,Lu,Gd)_3(Al,Ga)_5O_{12}:Ce$, $(Sr,Ca)AlSiN_3:Eu$, $3.5MgO \cdot 0.5MgF_2 \cdot GeO_2:Mn$, $(x-s)MgO \cdot (s/2)Sc_2O_3 \cdot yMgF_2 \cdot uCaF_2 \cdot (1-t)GeO_2 \cdot (t/2)M'_2O_3:zMn$, $Ca_3Sc_2Si_3O_{12}:Ce$, $CaSc_2O_4:Ce$, $(La,Y)_3Si_6N_{11}:Ce$, $(Ca,Sr,Ba)_3Si_6O_9N_4:Eu$, $(Ca,Sr,Ba)_3Si_6O_{12}N_2:Eu$, $(Ba,Sr,Ca)Si_2O_2N_2:Eu$, $(Ca,Sr,Ba)_2Si_5N_8:Eu$, $(Ca,Sr,Ba)S:Eu$, $(Ba,Sr,Ca)Ga_2S_4:Eu$, $K_2(Si,Ti,Ge)F_6:Mn$, and $Si_{6-z}Al_zO_zN_{8-z}:Eu$ $(0<z<4.2)$ phosphors.

A combination of two types of phosphors that are $Si_{6-z}Al_zO_zN_{8-z}:Eu$ $(0<z<4.2)$ and $K_2(Si,Ti,Ge)F_6:Mn$ phosphors is particularly preferably used for the phosphors. The combination of these two types of phosphors and blue light-emitting element(s) provides the light-emitting device 1 or 2 with good color reproducibility. It is more preferable to combine a $(Sr,Ca)AlSiN_3:Eu$ phosphor with the two types of phosphors that are $Si_{6-z}Al_zO_zN_{8-z}:Eu$ $(0<z<4.2)$ and $K_2(Si,Ti,Ge)F_6:Mn$ phosphors. Combining the $(Sr,Ca)AlSiN_3:Eu$ phosphor as the phosphors usable for the present disclosure can reduce, for example, the afterglow of the light-emitting device 1 or 2.

The content of the light scattering particles and/or the phosphor(s) is, for example, preferably approximately 10 wt % to 150 wt % of the total weight of the light-transmissive resin 70.

The embodiments of the present disclosure have been described above referring to specific examples. However, the present disclosure is not intended to require these specific examples. All embodiments that can be made through appropriate design changes made by a person skilled in the art on the basis of the above embodiments of the present disclosure are within the scope of the present disclosure as long as the embodiments involve the gist of the present disclosure. In addition, a person skilled in the art can think of various variations and modifications within the idea of the present disclosure. Therefore, those variations and modifications also fall within the scope of the present disclosure.

The invention claimed is:

1. A light-emitting device comprising:
   a package comprising:
      a first lead having a first groove on its upper surface and extending to a first lateral surface of the first lead;
      a second lead having a second groove on its upper surface, and separated away from the first lead, the second groove extending to a second lateral surface of the second lead; and
      a resin portion holding the first lead and the second lead,
      wherein the package has a depressed portion having a bottom surface on which a part of the upper surface of the first lead and a part of the upper surface of the second lead are not in direct contact with the bottom surface of the depressed portion, and
      wherein the first groove and the second groove are embedded in a lateral wall defining the depressed portion; and
   a light-emitting element mounted on or above the bottom surface of the depressed portion,
   wherein the first lateral surface of the first lead facing the second lead has a first recess recessed so as to be away from the second lead toward the first lead in a top view, and is continuous with an end of the first groove,
   wherein the second lateral surface of the second lead facing the first lead has a second recess recessed so as to be away from the first lead toward the second lead in the top view, and is continuous with an end of the second groove, and
   wherein, in the top view, a part of the resin portion is continuously disposed between the end of the first groove and the end of the second groove.

2. The light-emitting device according to claim 1, wherein a distance between the first lateral surface of the first lead and the second lateral surface of the second lead varies and the distance between the first lateral surface of the first lead and the second lead is largest in a portion having the first recess and the second recess.

3. The light-emitting device according to claim 1, wherein the light-emitting device has a first direction extending from the first lead toward the second lead, and a second direction intersecting the first direction,
   the light-emitting device includes a third lead disposed separately in the second direction,
   a third lateral surface of the first lead facing the third lead has a third recess recessed so as to be away from the third lead toward the first lead in the top view, and
   a fourth lateral surface of the third lead facing the first lead has a fourth recess recessed so as to be away from the first lead toward the third lead in the top view.

4. The light-emitting device according to claim 1, wherein a width of the first recess is equal to or larger than a width of the first groove, and a width of the second recess is equal to or larger than a width of the second groove.

5. The light-emitting device according to claim 1, wherein the first lead includes a first part and a second part each extending in a first direction from the first lead to the second lead, and
   the first recess is disposed between the first part and the second part in a second direction intersecting the first direction.

6. The light-emitting device according to claim 5, wherein the second lead includes a third part and a fourth part each extending along the first direction, and
   the second recess is disposed between the third part and the fourth part in the second direction.

7. The light-emitting device according to claim 1, wherein at least a part of the first recess overlaps with at least a part of the second recess in a second direction intersecting a first direction from the first lead to the second lead.

8. The light-emitting device according to claim 1, wherein a maximum length of the first groove is longer than a maximum length of the first recess in a second direction intersecting a first direction from the first lead to the second lead.

9. The light-emitting device according to claim 1, further comprising
   a third lead disposed separately from the first lead and the second lead, the third lead having a third groove on its upper surface, in the top view, the third groove being away from an outer edge of the third lead.

10. The light-emitting device according to claim 9, further comprising
    a fourth lead disposed separately from the first lead, the second lead, and the third lead, the fourth lead having a fourth groove on its upper surface, in the top view, the fourth groove being away from an outer edge of the fourth lead.

11. The light-emitting device according to claim 9, wherein
    the second lead does not overlap with the third lead in a first direction from the first lead to the second lead.

12. The light-emitting device according to claim 11, wherein
    the first lead overlaps with the third lead in the first direction.

13. The light-emitting device according to claim 2, wherein
    the first lead includes a first part and a second part each extending in a first direction from the first lead to the second lead, and
    the first recess is disposed between the first part and the second part in a second direction intersecting the first direction.

14. The light-emitting device according to claim 2, wherein
    at least one part of the first recess overlaps with at least one part of the second recess in a second direction intersecting a first direction from the first lead to the second lead.

15. The light-emitting device according to claim 2, wherein
    a maximum length of the first groove is longer than a maximum length of the first recess in a second direction intersecting a first direction from the first lead to the second lead.

16. The light-emitting device according to claim 5, wherein at least one part of the first recess overlaps with at least one part of the second recess in a second direction intersecting a first direction from the first lead to the second lead.

17. The light-emitting device according to claim 5, wherein
a maximum length of the first groove is longer than a maximum length of the first recess in a second direction intersecting a first direction from the first lead to the second lead.

18. The light-emitting device according to claim 7, wherein
a maximum length of the first groove is longer than a maximum length of the first recess in a second direction intersecting a first direction from the first lead to the second lead.

19. The light-emitting device according to claim 18, further comprising
a third lead disposed separately from the first lead and the second lead, the third lead having a third groove on its upper surface, in the top view, the third groove being away from an outer edge of the third lead.

20. The light-emitting device according to claim 19, wherein
a distance between the first lateral surface of the first lead and the second lateral surface of the second lead varies and the distance between the first lateral surface of the first lead and the second lateral surface of the second lead is largest in a portion having the first recess and the second recess.

* * * * *